United States Patent
Zanolli et al.

(10) Patent No.: US 7,758,350 B2
(45) Date of Patent: Jul. 20, 2010

(54) ELECTRICAL CONNECTOR WITH SOLDER RETENTION MEANS FOR ASSEMBLY

(75) Inventors: James R. Zanolli, North Smithfield, RI (US); Joseph S. Cachina, Warwick, RI (US)

(73) Assignee: Teka Interconnection Systems, Warwick, RI (US)

( * ) Notice: Subject to any disclaimer, the term of this patent is extended or adjusted under 35 U.S.C. 154(b) by 0 days.

(21) Appl. No.: 12/038,635

(22) Filed: Feb. 27, 2008

(65) Prior Publication Data

US 2008/0268676 A1    Oct. 30, 2008

Related U.S. Application Data

(60) Provisional application No. 60/914,255, filed on Apr. 26, 2007.

(51) Int. Cl.
    *H01R 12/00* (2006.01)
(52) U.S. Cl. .............. 439/65; 439/74; 439/629; 439/630; 439/876; 439/951; 361/743; 361/807; 228/180.1
(58) Field of Classification Search .............. 439/83, 439/629, 630, 951, 65, 74, 876; 361/743, 361/760, 807, 136; 228/180.1
See application file for complete search history.

(56) References Cited

U.S. PATENT DOCUMENTS

| | | | | |
|---|---|---|---|---|
| 4,900,279 A | * | 2/1990 | Dennis | 439/876 |
| 4,985,990 A | * | 1/1991 | Cronin et al. | 216/18 |
| 5,139,448 A | * | 8/1992 | Seidler | 439/876 |
| 6,261,136 B1 | * | 7/2001 | Dennis | 439/876 |
| 6,760,970 B2 | * | 7/2004 | Farnworth et al. | 29/842 |
| 6,863,578 B2 | * | 3/2005 | Templin et al. | 439/876 |
| 2001/0045009 A1 | | 11/2001 | Cachina et al. | |
| 2004/0023524 A1 | | 2/2004 | Ashman et al. | |

* cited by examiner

*Primary Examiner*—Edwin A. Leon
*Assistant Examiner*—Vanessa Girardi
(74) *Attorney, Agent, or Firm*—Weingarten, Schurgin, Gagnebin & Lebovici LLP

(57) ABSTRACT

An electrical connector for electrically connecting a first electronic device to a second electronic device includes a housing that includes a plurality of solder retention channels that hold a plurality of solder segments in a vertical orientation such that at least a vertical surface and one end of each solder segment are exposed. The solder retention channels are formed in first and second opposing rows with an open space formed therebetween. The exposed vertical surfaces of the solder segments face one another.

26 Claims, 8 Drawing Sheets

ELECTRICAL CONNECTOR WITH SOLDER RETENTION MEANS FOR ASSEMBLY

CROSS-REFERENCE TO RELATED APPLICATION

The present application claims the benefit of U.S. patent application Ser. No. 60/914,255, filed Apr. 26, 2007, which is hereby incorporated by reference in its entirety.

TECHNICAL FIELD

The present invention relates to the field of devices for joining connectors or other electrical components to one another and, more particularly, to a method and apparatus for facilitating the soldering of first electronic devices, such as connectors, to second electronic devices, such as printed circuit boards.

BACKGROUND

It is often necessary and desirable to electrically connect one component to another component. For example, a multi-terminal component, such as a connector, is often electrically connected to a substrate, such as a printed circuit board, so that the terminals of the component are securely attached to contact pads formed on the substrate to provide an electrical connection therebetween. One preferred technique for securely attaching the component terminals to the contact pads is to use a solder material around a particular area, such as a hole, which typically receives one component terminal. Often, the component terminals may be in the form of conductive pins which are received within the holes formed in the substrate. The solder material, e.g., solder paste, is generally applied around each contact hole and then heated after the conductive pin is received within and extends through the contact hole. The heating of the solder paste causes the solder paste to flow around the conductive pin and the contact hole. The cooling of the solder paste results in the conductive pin being securely attached to one of the contact pads formed on the substrate.

While the use of solder paste is effective in some applications, there are a number of applications in which the use of solder paste is not desirable due to a number of factors, including but not limited to the design of both the component terminals and the substrate itself. In addition, the use of solder paste generally does not provide a sufficient volume of solder to properly join the component terminals and the contact pads.

It is therefore desirable to provide an alternative device and method for applying solder to connectors or the like.

SUMMARY

An electrical connector for electrically connecting a first electronic device to a second electronic device includes a housing that includes a plurality of solder retention channels that hold a plurality of solder segments in a vertical orientation such that at least a vertical surface and one end of each solder segment are exposed. The solder retention channels are formed in first and second opposing rows with an open space formed therebetween. The exposed vertical surfaces of the solder segments face one another.

In another embodiment, an electrical connector is provided for electrically connecting at least one first contact of a first electronic device to at least one second contact of a second electronic device. The electrical connector includes a housing that includes at least one solder retention channel that holds a solder segment in a vertical orientation such that at least a vertical surface and a bottom end of the solder segment are exposed. The housing has a slot formed adjacent the solder retention channel and solder segment for receiving the first electronic device. The first electronic device is for placement perpendicular to the second electronic device such that the at least one first contact formed along a vertical face of the first electronic device is disposed adjacent the solder segment and the at least one second contact formed along a top surface of the second electronic device is disposed below the solder segment such that upon reflow of the solder segment, an electrical connection is formed between the first contact and the second contact.

BRIEF DESCRIPTION OF THE DRAWINGS

Objects and features of the present invention will be described hereinafter in detail by way of certain preferred embodiments with reference to the accompanying drawings, in which.

DETAILED DESCRIPTION OF THE PREFERRED EMBODIMENT

In one aspect, the present invention facilitates the process of soldering electrical pads or contacts of one electronic device to electrical pads or contacts of a second electronic device using a solder-bearing wafer or connector.

Figure 1:
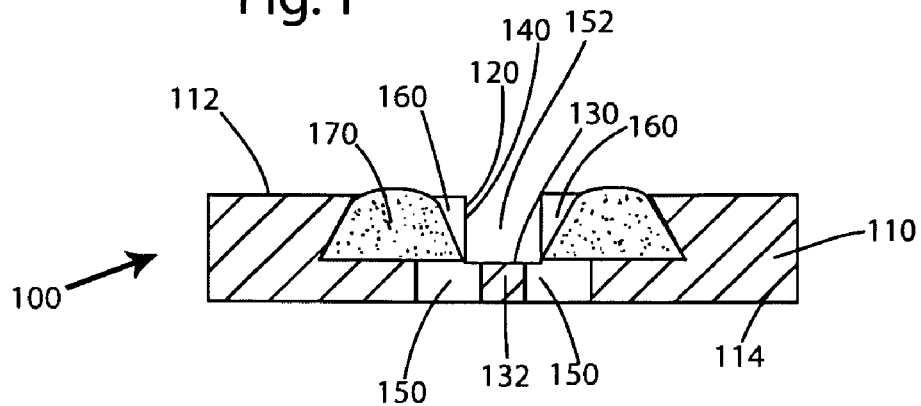
FIG. 1 is a cross-sectional view of a connector according to one embodiment.
Figure 2:
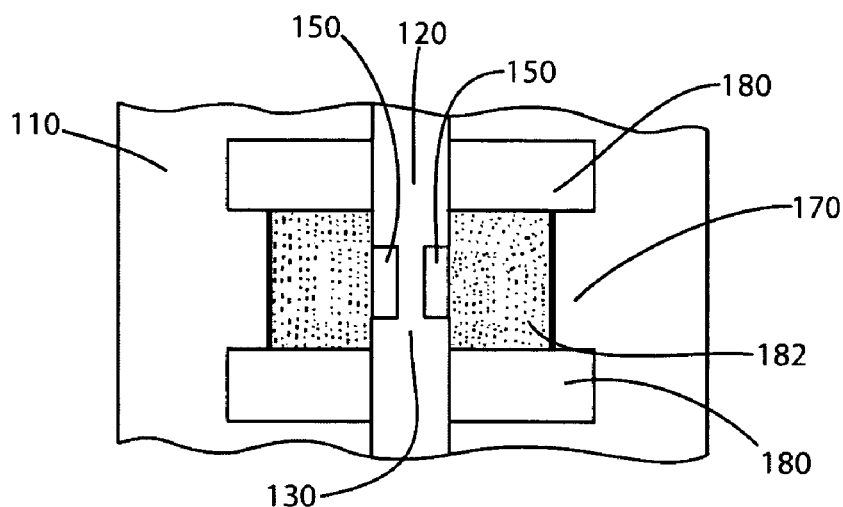
FIG. 2 is a top plan view of the connector of FIG. 1.

FIG. 1 shows a connector 100 in the form of a wafer or connector housing that is formed of a body 110. The body 110 can have any number of different shapes and in the illustrated embodiment, the body 110 has a rectangular shape. The body 110 has an upper surface 112 and an opposite lower surface 114.

A first groove or channel 120 is formed within the upper surface 112 and the bottom of the channel 120 is defined by a floor 130. In the illustrated embodiment, the channel 120 is also formed of two spaced vertical walls 140 (right angle to the floor 130).

The body 110 also includes at least one and preferably a plurality of first reflow openings or channels or passageways 150. Each of the reflow channels 150 is in communication with the floor 130 and the lower surface 114. The reflow channel 150 can be in the form of vertical channel that extends between the interior cavity (compartment) 152 of the groove 120 and also forms an opening along the lower surface 114.

When there are a plurality of reflow channels 150, the channels 150 can be formed in two rows along side edges of the floor 130, where the vertical walls 140 intersect the floor 130, so that a central portion 132 of the floor 130 remains between the reflow channels 150 for supporting an object (e.g., electronic device).

The body 110 also includes at least one and preferably a plurality of second reflow channels or openings 160 that are formed in the vertical walls 140 that define the groove or channel 120 so that they are in communication with the interior of the channel 120.

The connector 100 is designed to receive and hold at least one and preferably a plurality of solder masses (segments) 170. The body 110 includes a plurality of trim slots 180 (through holes) that are formed on opposite sides of a landing 182 on which one solder segment 170 sits. The trim slots 180 are formed for manufacturing reasons in that a larger than needed solder mass 170 is initially disposed across the two spaced trim slots 180 and across the landing 182 and then a punch or similar device passes through the two spaced slots 180 so to cut the solder mass into a segment 170 that remains only on the landing 182.

In accordance with the illustrated embodiment, at least one first reflow channel 150 and at least one second reflow channel 160 are in communication with the solder segment 170 sitting on the landing 182. In other words, the first reflow channel 150 and the second reflow channel 160 open into the space defined above the landing 182. It will therefore be appreciated that the reflow channels 150, 160 are specifically located such that upon reflow, the solder segment 170 (resting on the landing 182) reflows into and through both the first reflow channel 150 and the second reflow channel 160 as shown in FIG. 3.

Figure 3:
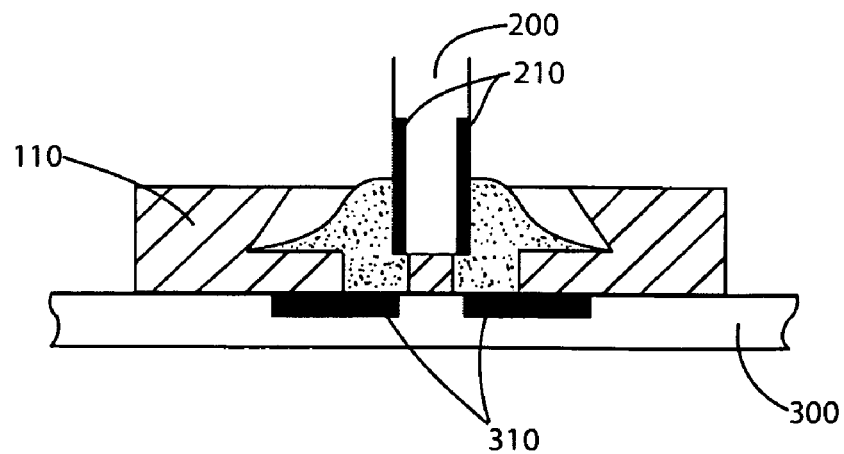
FIG. 3 is a cross-sectional view of the connector of FIG. 1 used to connect a daughter PCB to a host PCB.
Figure 4:
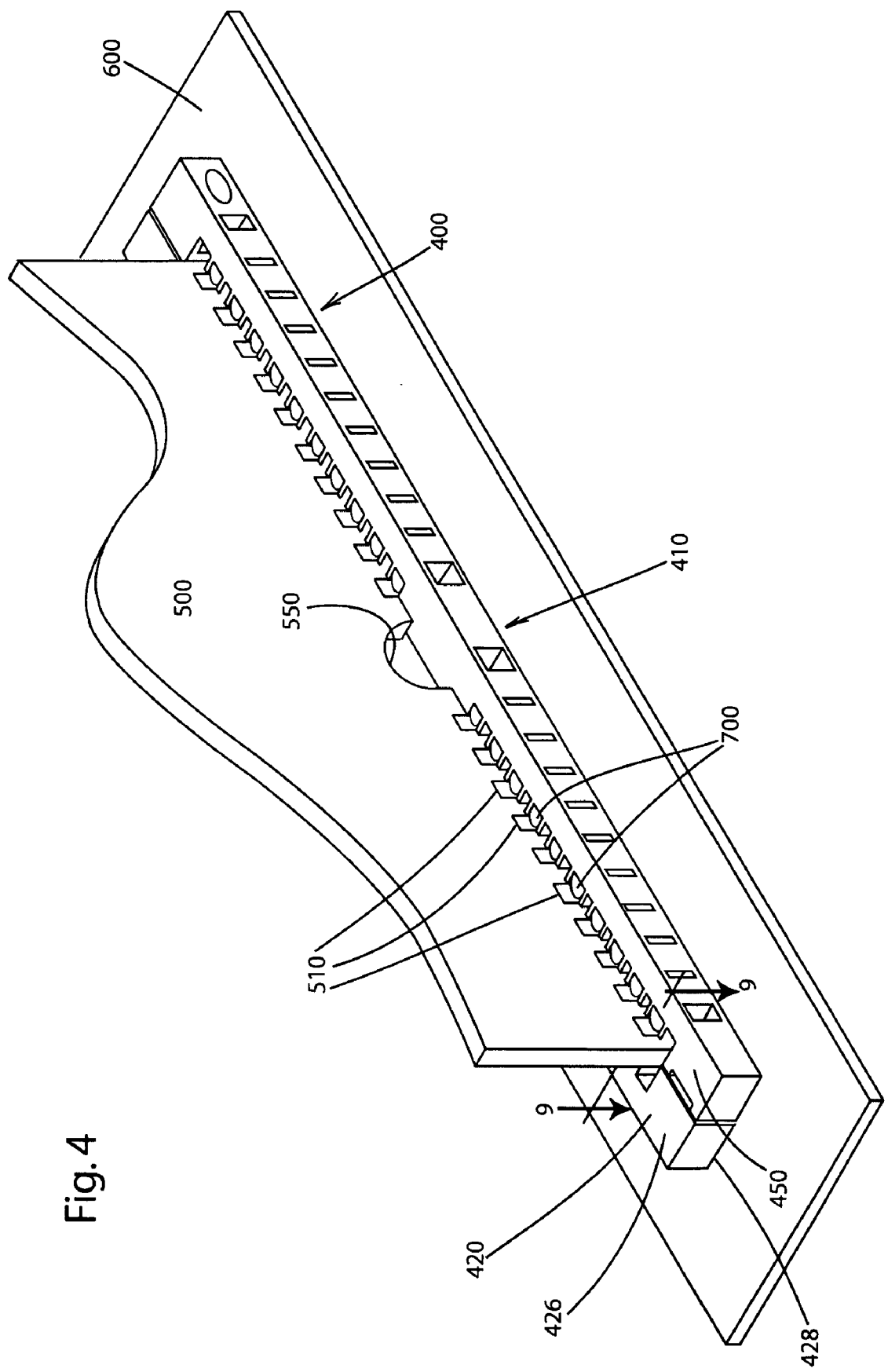
FIG. 4 is a perspective view of a connector according to a second embodiment in an assembled condition prior to reflow.

As shown in FIG. 3, the connector 100 is designed to electrically connect a first electronic device 200 to a second electronic device 300 and in particular, electrically connects a contact or conductive element 210 of the first electronic device 200 to a contact or conductive element 310 of the second electronic device 300.

The first electronic device 200 (e.g., daughter PCB) is received into the groove 120 and is supported between the vertical walls 140 so that is remains upright (vertical design). The second reflow channels 160 are formed within the vertical walls 140 so that they align with contacts (conductive/solderable pads) 210 of the first electronic device 200. The first reflow channels 150 are formed to align with the contacts 310 of the second electronic device 300. In the illustrated embodiment, the second electronic device 300 is a host PCB that is horizontally located relative to the first electronic device 200 (vertical PCB).

The body 110 is formed of a non-solderable material and thus, upon reflow, each solder segment 170 reflows such that the solder is directed to wet the two contacts 210, 310. In other words, during solder reflow, the solder reflows through the first channel 150 and into contact with the contact 310 (host PCB), as well as reflow through the second channel 160 and into contact with the contact 210 (daughter PCB).

Upon cooling, a secure electrically connection is formed between the contact 210 and the contact 310.

FIGS. 4-9 illustrate a connector 400 according to another embodiment. The connector 400 is similar to the connector 100 in that it is designed to electrically connect a first electronic device 500 (daughter PCB) to a second electronic device 600 (host PCB) and in particular, it electrically connects a contact or conductive element 510 of the first electronic device 500 to a contact or conductive element 610 of the second electronic device 600.

As shown in the FIGS., the connector 400 has a housing 410 that holds solder segments 700 in a vertical orientation as described below for the purpose of electrically connecting one contact 510 of the first electronic device 500 to one contact 610 of the second electronic device 600. The housing 410 is actually formed of two parts the engage and are mated with one another to form the assembled connector 400 shown in FIG. 1. In particular, the housing 410 is formed of a first part 420 and a second part 450 that selectively mate with each other.

The first and second parts 420, 450 can be formed of a number of different materials, including but not limited to a variety of different plastic materials. For example, the first and second parts 420, 450 can be formed as molded plastic parts and it will be appreciated that the connector 400 (parts 420, 450) is not formed as a stamped contact member that includes metal contacts.

The first part 420 is an elongated member that has a first end 422 and an opposing second end 424, as well as a top surface 426 and an opposing bottom surface 428. The first part 420 can be at least partially a hollow member.

In between the first end 422 and the second end 424, the first part 420 includes a plurality of solder receiving members 430, each of which is configured to receive and hold a solder segment 700. Each solder receiving member 430 includes a solder receiving channel 431 that is defined by a pair of opposing vertical side walls 432 and a rear vertical wall 434. The solder receiving members 430 are spaced from one another resulting in the solder segments 700 being spaced from one another. As seen in the top plan view of FIG. 6, the solder segments 700 are oriented in an axial orientation in that they are formed along a common axis from one end 422 to the other end 424.

The illustrated solder segments 700 each is in the form of an elongated segment of solder material that includes a first end 702, opposing second end 704 and an inner surface 706 and an opposing outer surface 708 that faces the other part 420, 450. When the rear vertical wall 434 is a planar surface as illustrated, the inner surface 706 of the solder segment 700 will likewise be a flat planar surface. The opposing outer surface 708 can be a rounded surface as illustrated or it can be flat surface. Similarly, the side walls 432 are planar surfaces and therefore, sides 709 of the solder segment 700 can likewise be flat planar surfaces.

It will be appreciated that the dimensions of the solder segments 700 and the dimensions of the solder receiving channels 431 are selected in view of one another so that the solder segments 700 are intimately held within the solder receiving channels 431. The solder receiving channels 430 are vertically oriented with respect to the first part 420 in that they extend in an up-and-down orientation. The depth of the solder segment 700 can be greater than the depth of the solder receiving member 430 and solder receiving channel 431 such that the inner face or surface 702 of the solder segment 700 protrudes beyond the solder receiving member 430 in a direction toward the second part 450.

The ends 422 and 424 and a middle section 425 are the sections of the first part 420 that are configured to mate with complementary sections of the second part 450 for securely coupling the first and second parts 420, 450 to one another. In order to attach the first and second parts 420, 450 to one another, the first part 420 can include a number of fastening elements that mate with complementary fastening elements of the second part 450. For example, the first part 420 can include a plurality of finger-like protrusions 440 that extend outwardly from the inner section of the first part 420. In the illustrated embodiment, the first part 420 includes a first fastening element 442 that is positioned near or at the second end 424 of the first part 420 and extends outwardly from the inner section of the first part 420. In addition, the middle section 425 includes a second fastening element 444 that extends outwardly from the inner section of the first part 420.

The first end 422 of the first part 420 includes an opening or slot 427 formed therein. The opening 427 includes interlocking features, such as snap-locking features, that permit a complementary protrusion (fastening element) of the second part 450 to interlockingly mate therewith.

Similar and complementary to the first part 420, the second part 450 is an elongated member that has a first end 452 and an opposing second end 454, as well as a top surface 456 and an opposing bottom surface 458. The second part 450 can be at least a partially hollow member.

In between the first end 452 and the second end 454, the second part 450 includes a plurality of solder receiving members 460, each of which is configured to receive and hold a solder segment 700. Each solder receiving member 460 includes a solder receiving channel 461 that is defined by a pair of opposing vertical side walls 462 and a rear vertical wall 464. The solder receiving members 460 are spaced from one another resulting in the solder segments 700 being spaced from one another. As seen in the top plan view of FIG. 6, the solder segments 700 are oriented in an axial orientation in that they are formed along a common axis from one end 462 to the other end 464.

When the rear vertical wall 464 is a planar surface as illustrated, the inner surface 706 of the solder segment 700 will likewise be a flat planar surface. Similarly, the side walls 462 are planar surfaces and therefore, sides 709 of the solder segment 700 can likewise be flat planar surfaces.

It will be appreciated that the dimensions of the solder segments 700 and the dimensions of the solder receiving channels 461 are selected in view of one another so that the solder segments 700 are intimately held within the solder receiving channels 461. The solder receiving channels 460 are vertically oriented with respect to the second part 450 in that they extend in an up-and-down orientation. The depth of the solder segment 700 can be greater than the depth of the solder receiving member 460 and solder receiving channel 461 such that the inner face or surface 702 of the solder segment 700 protrudes beyond the solder receiving member 460 in a direction toward the first part 420.

The ends 462 and 464 and a middle section 455 are the sections of the second part 450 that are configured to mate with complementary sections of the first part 420 for securely coupling the first and second parts 420, 450 to one another. In order to attach the first and second parts 420, 450 to one another, the second part 450 can include a number of fastening elements that mate with complementary fastening elements of the first part 420. For example, the second part 450 can include a plurality of finger-like protrusions 470 that extend outwardly from the inner section of the second part 450. In the illustrated embodiment, the second part 450 includes a first fastening element 472 that is positioned near or at the first end 452 of the second part 450 and extends outwardly from the inner section of the second part 450. In addition, the middle section 455 includes a second fastening element 474 that extends outwardly from the inner section of the second part 450.

The second end 454 of the second part 450 includes an opening or slot 457 formed therein. The opening 457 includes interlocking features, such as snap-locking features, that permit a complementary protrusion, in this case the first fastening element 442 of the first part 420 to interlockingly mate therewith. For example, when the two parts 420, 450 mate together, the protrusion 442 is received in the opening 457, the protrusion 444 is received in an opening 469 formed in the middle section 455, the protrusion 474 is received in an opening 429 in the middle section 425, and the protrusion 472 is received in the opening 427. As previously mentioned, the two parts 420, 450 can snap-fittingly mate with one another or another type of fastening scheme can be used.

It will be understood from the drawing figures that when the two parts 420, 450 mate together, the solder segments 700 that are held within the solder receiving members 430 of the first part 420 are across from and aligned with the solder segments 700 that are held within the solder receiving members 460 of the second part 450. More specifically, the complementary pairs of fastening elements mate together to cause the first and second parts 420, 450 to be connected and the solder segments 700 are properly aligned so that matching, opposing pairs of solder segments 700 are defined and are properly positioned for electrically connecting the first electronic device 500 to the second electronic device 600.

Any number of different types of fastening elements can be used in order to connect the two parts 420, 450 to one another.

It will also be understood that the fastening elements for attaching the first and second parts 420, 450 to one another can be of the type that is disengagable and therefore, the first and second parts 420, 450 could be reused in certain situations. In other embodiments, a more permanent connection between the first and second parts 420, 450 can be provided by means of snap-fit connections or the like where once the two parts 420, 450 are locked to one another, they can not easily be separated. As shown in the FIGS., the two parts 420, 450 are attached not only at their ends but they are also attached in the middle section.

Of course, the first and second parts 420, 450 initially come separated from one another to permit the solder segments to easily be loaded into the respective solder receiving members thereof. For example, an automated system can be provided for partitioning a long solder segment into individual solder segments 700 that have the proper dimensions and shapes and then the machine can place the individual segments 700 into their respective solder receiving members. In particular, an automated piston or finger can controllably contact and direct the individual solder segment into one solder receiving member. As previously mentioned, the solder segment 700 can be frictionally held between the wall surfaces that define the solder receiving member.

In this particular embodiment, the solder segments 700 are held vertically within the solder receiving members of the first and second parts 420, 450. Since the solder segments 700 are arranged in opposite facing pairs, they define a plurality of solder points for electrically connecting the first electronic device 500 to the second electronic device 600.

Figure 7:
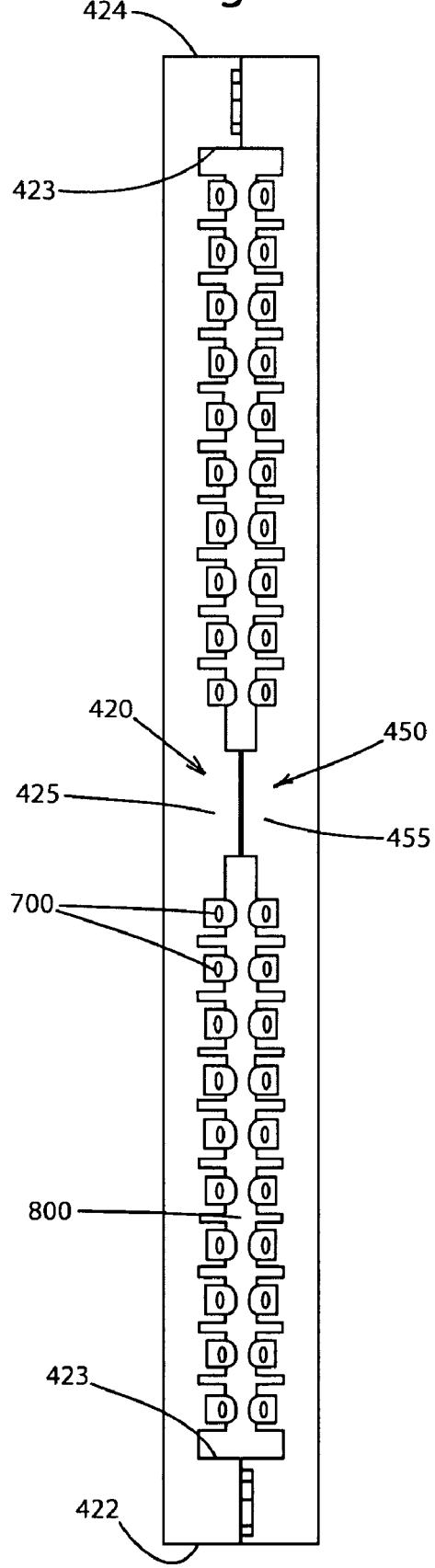
FIG. 7 is a top plan view of the connector in an assembled state.
Figure 8:
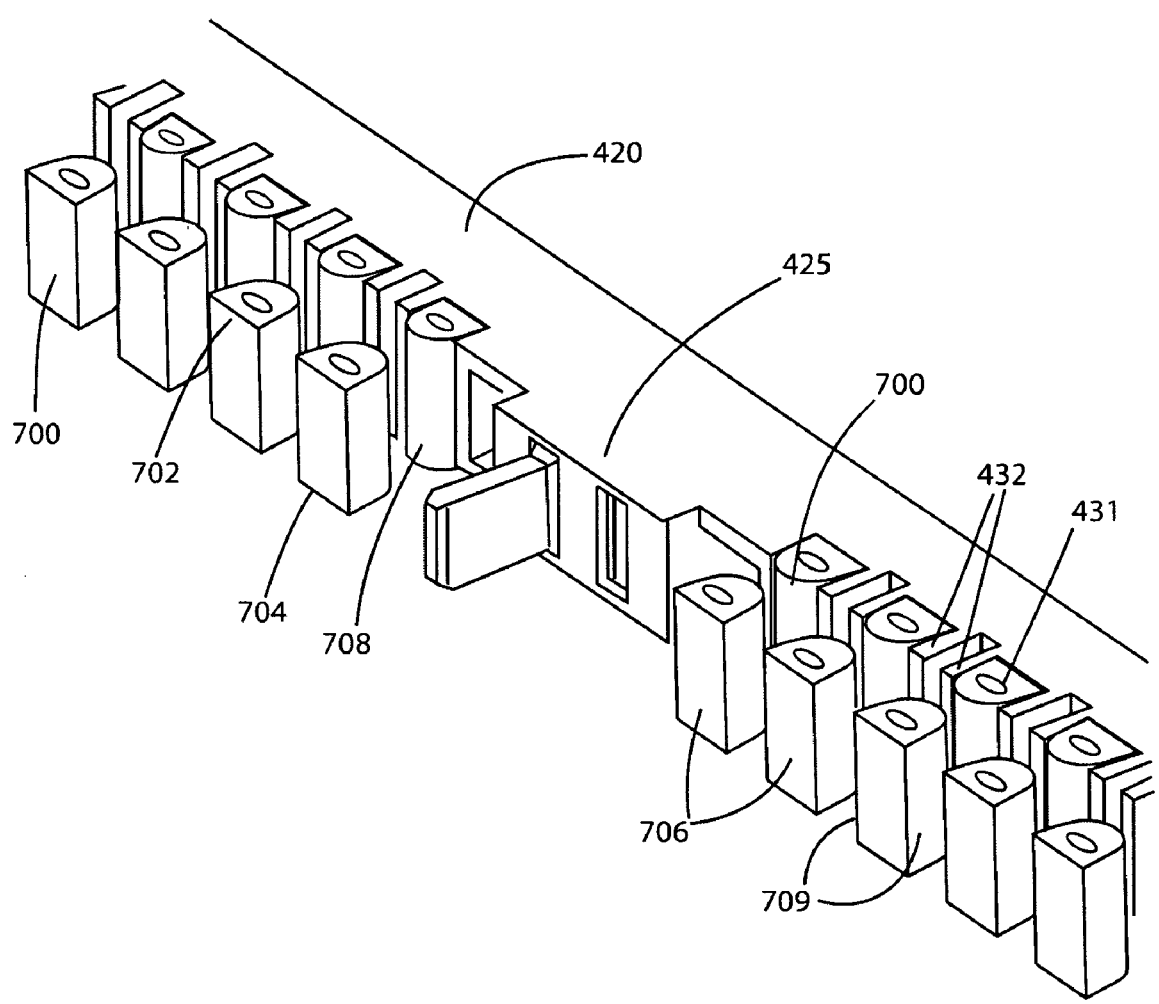
FIG. 8 is an exploded perspective view of one part of the connector and the solder segments.

It will also be appreciated that as shown in FIG. 7, when the first and second parts 420, 450 are mated together, a space of gap 800 is formed between the outer surfaces 708 of the solder segments 700 that spaced across from one another. This space 800 is designed to receive a member such that the member is placed in intimate contact with the solder segments 700 of both the first and second parts 420, 450. In the illustrated embodiment, the gap 800 is generally rectangular shaped. In addition, the gap or space 800 between any opposing pair of solder segments 700 should be the same. In other words, there should be a uniform distance between each opposing pair of solder segments 700 since the gap formed therebetween is designed to receive the first electronic device 500 which typically has a uniform thickness. When the first electronic device 500 is received within the gap 800, the first electronic device 500 is in intimate contact with each of the solder segments 700 associated with the first and second parts 420, 450 as the first electronic device 500 stands upright in the gap 800.

The middle sections of the two parts 420, 450 partition the gap 800 into two different sections and in particular, there is a first gap 800 that is formed between the middle sections and the first ends of the two parts 420, 450 and a second gap 800 that is formed between the middle sections and the second ends of the two parts 420, 450. In addition, while the illustrated embodiment shows that each of the first and second parts 420, 450 includes two sets of ten solder segments 700, it will be understood that this number of solder segments 700 is merely for illustration and each of the parts 420, 450 can carry more or less than this number of solder segments. In addition, it is not a requirement that the middle section of each part 420, 450 partitions the solder segments 700 into two sets of an equal number of solder segments. Thus, one set of solder segments can be greater in number than the other set of solder segments.

The manner of assembling and using the connector 400 will now be described with reference to the drawing figures. As previously mentioned, the first electronic device 500 is in the form of a substrate (e.g., printed circuit board) that has a lower edge 502. Along the lower edge 502, the first electronic device 500 has a plurality of contacts 510 which can be in the form of conductive pads that are spaced apart at selected intervals along the lower edge 502. In this illustrated embodiment, the conductive pads 510 have rectangular shapes; however, the pads 510 can have any number of other shapes, including square shape, oval, circular, etc. As will be appreciated, the first electronic device 500 is a vertical mount type printed circuit board or the like in that it stands upright when mounted to the second electronic device 600. The first electronic device 500 also has opposing vertical faces in that it includes a first vertical face 520 and an opposing second vertical face 530. The conductive contacts 510 are disposed along the lower edge 502 of each of the first vertical face 520 and the second vertical face 530. In this manner, the conductive pads 510 are located on opposite sides from one another; however, they are positioned in the same locations of the respective vertical faces 520, 530. In addition, the spacing between the conductive pads 510 is preferably the same on one face 520 as it is on the other face 530.

In order for the middle sections 425, 455 of the first and second parts 420, 450 to be accommodated, the first electronic device 500 includes a cutout 550 to accommodate the fastening elements of the two parts 420, 450. In the illustrated embodiment, the cutout 550 has a semi-circular shape; however, it is not limited to having such a shape but instead can have any number of other shapes, including but not limited to a square shape, etc., so long as the cutout 550 permits the fastening elements to pass therethrough and permits the first electronic device to be received within the two gaps 800 on either side of the middle sections to allow the first electronic device 500 to sit flush against the second electronic device 600 as described below.

The second electronic device 600 is thus a horizontal type device and it includes a top surface 602. The top surface 602 is the surface that contains the contacts 610 and in particular, the contacts 610 are arranged in two rows of spaced apart contacts. For example, the contacts 610 are arranged axially in a first row 613 of contacts 610 and a second row 615 of contacts 610 with a space 620 formed between. The space 620 has a generally rectangular shape.

In the illustrated embodiment, the contacts 610 have a square or rectangular shape; however, once again, the contacts 610 are not limited to such shapes and instead, can have any number of different shapes.

The number of contacts 510 is typically equal to the number of contacts 610 so that for each contact 510 there is a corresponding contact 610 that is properly positioned relative thereto. The spacing between the two rows of contacts 610 is about equal to a thickness of the first electronic device 500 and the area 620 is thus formed between the two rows that is free of any conductive material. It is within this area 620 that a bottom edge 503 of the first electronic device 500 sits.

The spacing between the contacts 610 should be about equal to the spacing between the contacts 510 so that when the first and second electronic devices 500, 600 are arranged relative to one another, each contact 610 in row 613 has a corresponding contact 510 that is formed along the lower edge 502 of the first vertical face 520. Similarly, each contact 610 in row 615 has a corresponding contact 510 that is formed along the lower edge 502 of the second vertical face 530.

Since the first electronic device 500 is mounted perpendicular to the second electronic device 600, the corresponding pairs of contacts 510, 610 are likewise oriented perpendicular to one another as shown in the FIGS.

In order to properly position the first and second electronic devices 500, 600, the first electronic device 500 is positioned so that the contacts 610 in the row 613 are positioned proximate the contacts 510 along the edge 502 of the first vertical face 520 and similarly, the contacts 610 in the row 615 are positioned proximate the contacts 510 along the edge 502 of the second vertical face 530. More specifically, a right angle is formed between each contact 610 and the corresponding contact 510.

Figure 5:
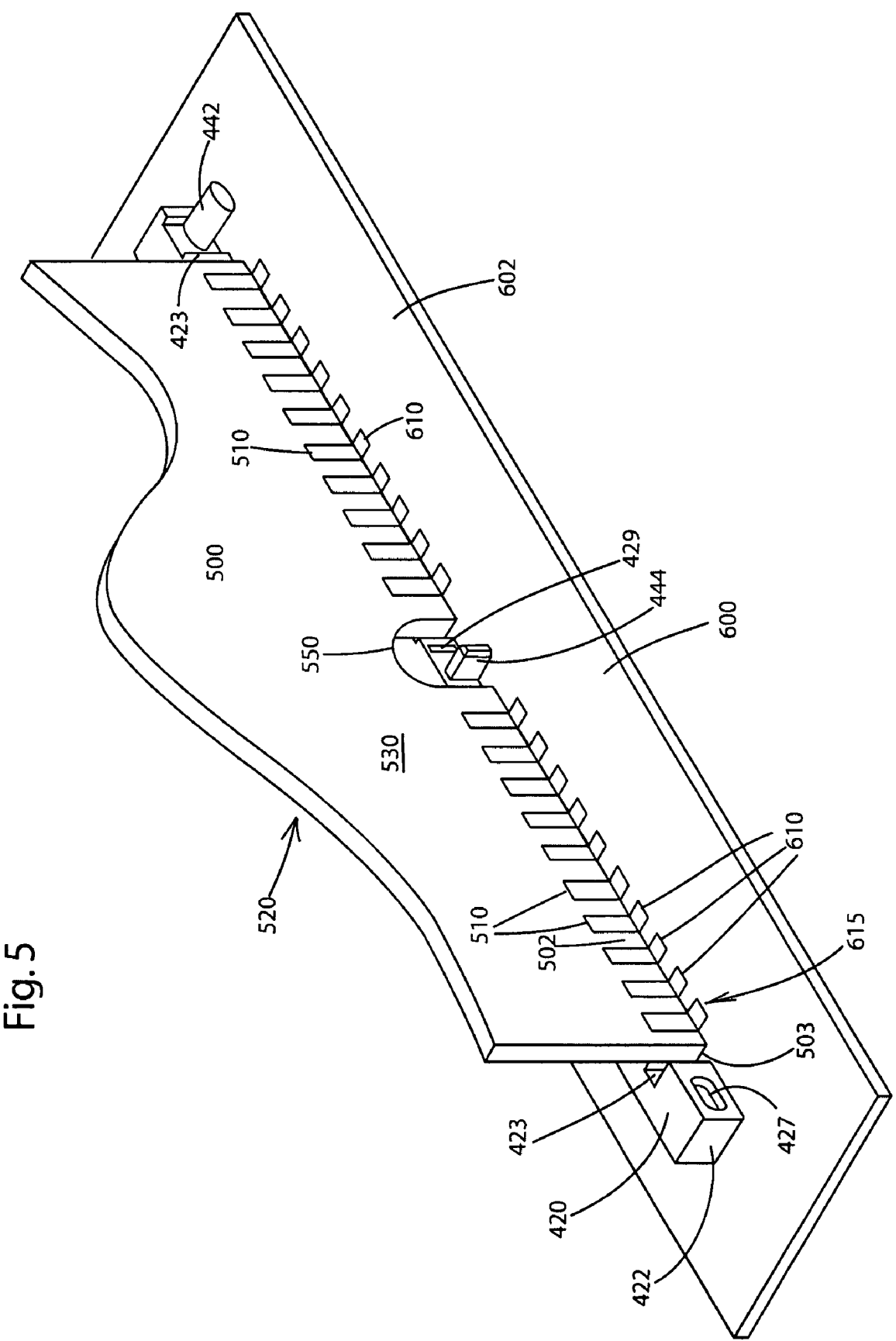
FIG. 5 is a perspective view, partially exploded, of the connector of FIG. 4.

In order to electrically connect the first electronic device 500 to the second electronic device 600, one of the parts 420, 450 of the connector 400 is positioned with respect to the vertically oriented first electronic device 500. For example and as shown in FIG. 5, the first part 420 is positioned relative to the first electronic device 500 such that the solder segments 700 held within the solder receiving members of the first part 420 face both the contacts 510 and the contacts 610. Near each end 422, 424, the first part includes a pair of end walls 423 that define the ends of the gap 800 and also serve as a locator and a stop for limiting the movement of the first electronic device 500 within the gap 800 when the connector 400 is assembled. The first electronic device 500 is thus disposed between the end walls 423. The end walls 423 also define the beginning of the end sections that are securely fastened to one another to attach the first and second parts 420, 450. As can be seen in the FIGS., the end sections have inner walls that are placed in intimate contact with one another when the first and second parts 420, 450 are connected to form the assembled connector 400.

The first part 420 is disposed over the top surface of the second electronic device 600 and is positioned so that the solder segments 700 are disposed over the contacts 610, while at the same time, the outer surface 708 of the solder segment 700 is placed proximate to or in intimate contact with the vertically oriented contacts 510 of the first electronic device 500. Thus, there is one solder segment 700 for every one pair of contacts 510, 610 and it is this solder segment that serves to electrically connect the contacts 510, 610 to one another upon reflow as described below.

The protrusions 444, 474 are received through the cutout 550 to permit them to mate with the corresponding openings 469, 429 and the fastening elements 442, 472 are located in the end sections of the first and second parts 420, 450 beyond the solder segments 700 and beyond where the first electronic device 500 is located. The end sections and the fastening elements 442, 472 thus capture and surround the ends of the first electronic device 500. It will be appreciated that when the first and second parts 420, 450 mate with one another, the corresponding fastening elements are hidden from view since the inner surfaces of the parts 420, 450 seat flush against one another.

When the fastening elements of the first and second parts 420, 450 mate with one another, the two parts 420, 450 are securely attached to one another with the first electronic device 500 being received within the gap 800 and the solder segments 700 being properly positioned so that each solder segment 700 is disposed over one contact 610 and adjacent one contact 510.

Figure 9:
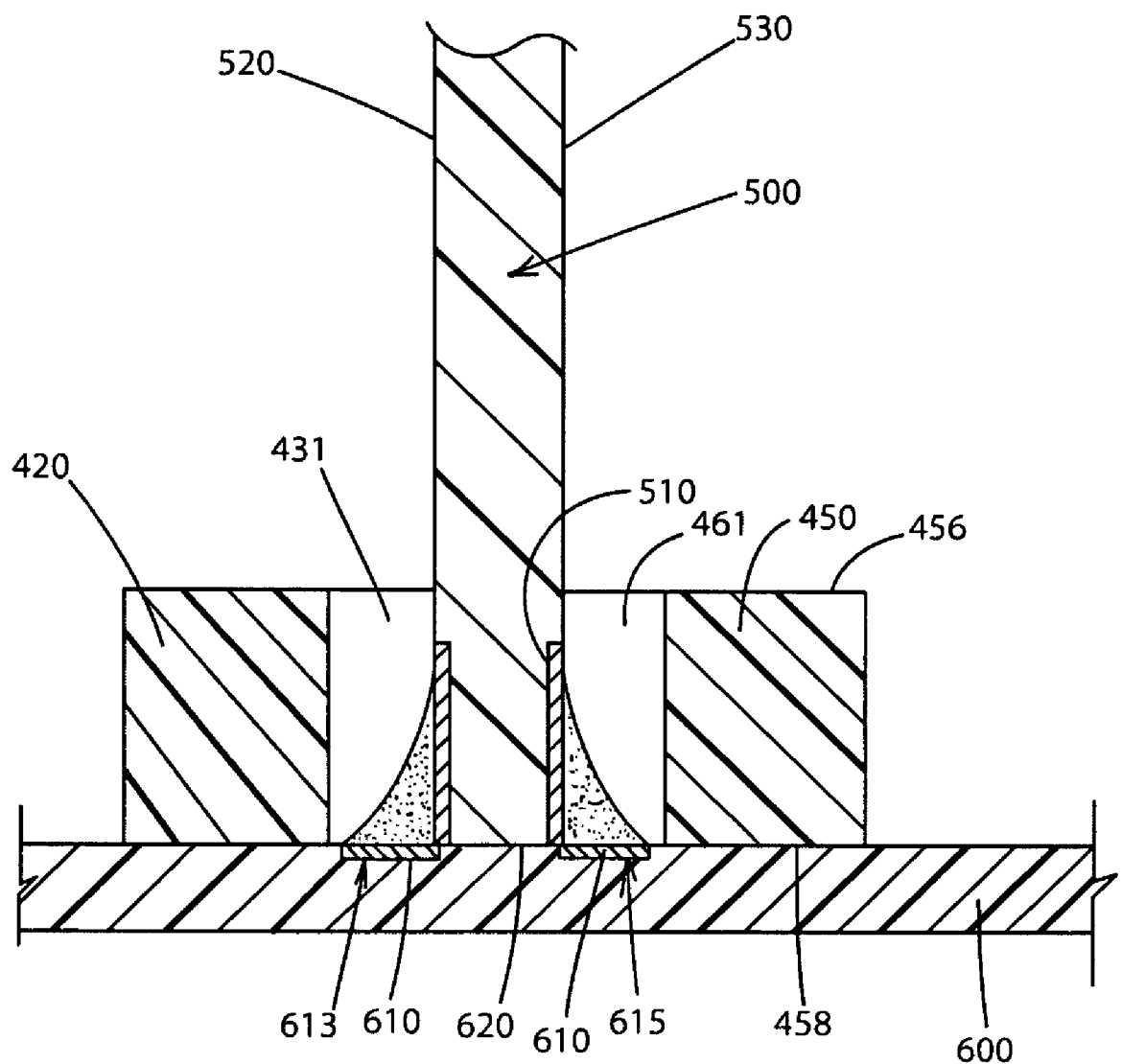
FIG. 9 is a cross-sectional view taken along the line 9-9 of FIG. 4.

To electrically connect the first and second electronic devices 500, 600 to one another, connector 400 and the solder segments 700 are exposed to heat, using conventional techniques, to cause the solder segments 700 to reflow. FIG. 9 shows the solder segments 700 in the reflowed condition and in particular, when each solder segment 700 reflows, the solder segment flows into contact with the contact 610 and contact 510 where it hardens when the heat is removed. In this manner, the solder segment 700 provides an electrical connection between the contact 610 to the contact 510. The reflow of the solder segment 700 occurs within the solder channels 431, 461. It will be seen that these channels 431, 461 overlie the contacts 610 when the connector 400 is placed over the connector 400.

Alternatively, the first and second parts 420, 450 can already be attached to one another with the solder segments 700 being securely carried therein. In this case, the lower edge 502 of the first electronic device 500 is simply inserted into the gap 800 and then the first electronic device 500 and the connector 400 are positioned relative to the second electronic device 500 such that the solder segments 700 are positioned over the contacts 610. In this embodiment, the connector 400 is specifically sized to receive a certain type (e.g., thickness) of first electronic device 500. Different connectors 400 can be provided for different sized (e.g., different thicknesses) daughter cards (first electronic devices 500).

It will also be understood that the connector 400 of the present invention is constructed to permit a customer to press fit together two separate connector pieces, namely, parts 420, 450, in a manner that accommodates a multiplicity of daughter cards (first electronic devices 500) of various sizes (e.g., different thicknesses).

Figure 10:
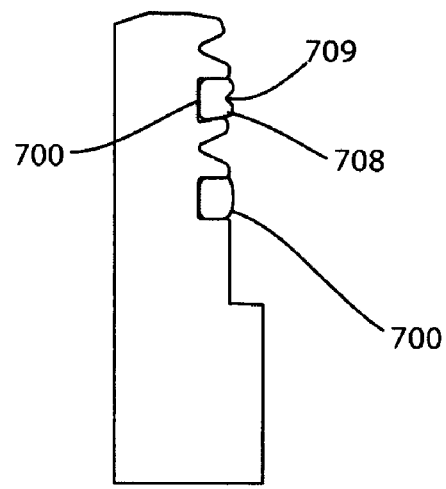
FIG. 10 is a top plan view of a part of the connector carrying a deformed solder segment for improved retention in a channel formed therein.

In the embodiment of FIGS. 4-9, the solder segment 700 is retained within the respective connector part 420, 450 by a solder deformation having a dove tail shape. In FIG. 10, the solder segment 700 is modified for improved retention and more specifically, a tool is pressed against the outer surface 708 of the solder segment 700 to form a dented or recessed section 709. The formation of the recessed section 709 helps better drive the solder segment 700 into corners of the dove tail shape of the solder receiving member. The tool can be part of an automated system in which case after one automated member places the solder segment 700 into the solder receiving member, another automated member contacts and presses the solder segment 700 into the corners of the dove tail shaped member, thereby forming the recessed section 709. The illustrated recessed section 709 has a triangular or V-shape.

Figure 11A:
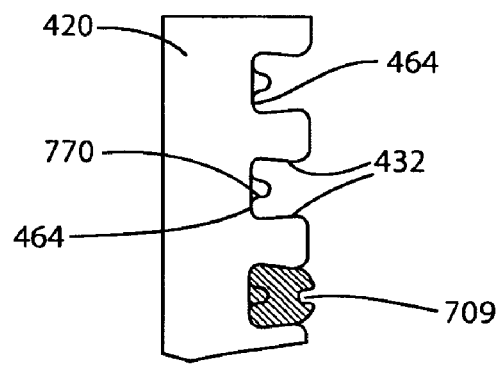
FIG. 11A is a top plan view of a part of the connector with a solder retention element formed in the channel thereof for restricting axial movement of the solder segment.

FIGS. 11A and B show another means for improving solder retention in the channel of the solder retention member. In this embodiment, a solder retention feature 770 is formed in the solder retention channel. The solder retention feature 770 can be in the form of a step, tab or protrusion that extends outwardly from the rear wall 464. In one embodiment, the step 770 is located in the middle of the channel (e.g., in both vertical and transverse directions). The step 770 is designed to limit the axial movement of the solder segment 700 within the solder retention channel.

Figure 11B:
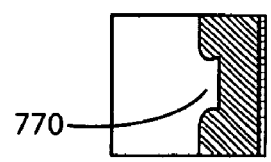
FIG. 11B is a close-up, top plan view of the solder retention element embedded into the solder segment.

In other words, the solder retention feature 770 improves solder axial retention within the connector 400 since the insertion of the solder segment 400 into the solder channel results in the feature 770 being pressed into the body of the solder segment 700 as shown in FIG. 11B. The insertion of the feature 770 into the body of the solder segment 700 limits the up-and-down (vertical axis) movement of the solder segment 700 within the solder channel since the feature 770 serves to hold the solder segment 700 in place within the channel. The precise shape of the feature 770 is not critical. In the illustrated embodiment, the feature 770 has a rounded free edge and has a shape similar to a guitar pick shape; however, this is only one exemplary shape.

Figure 6:
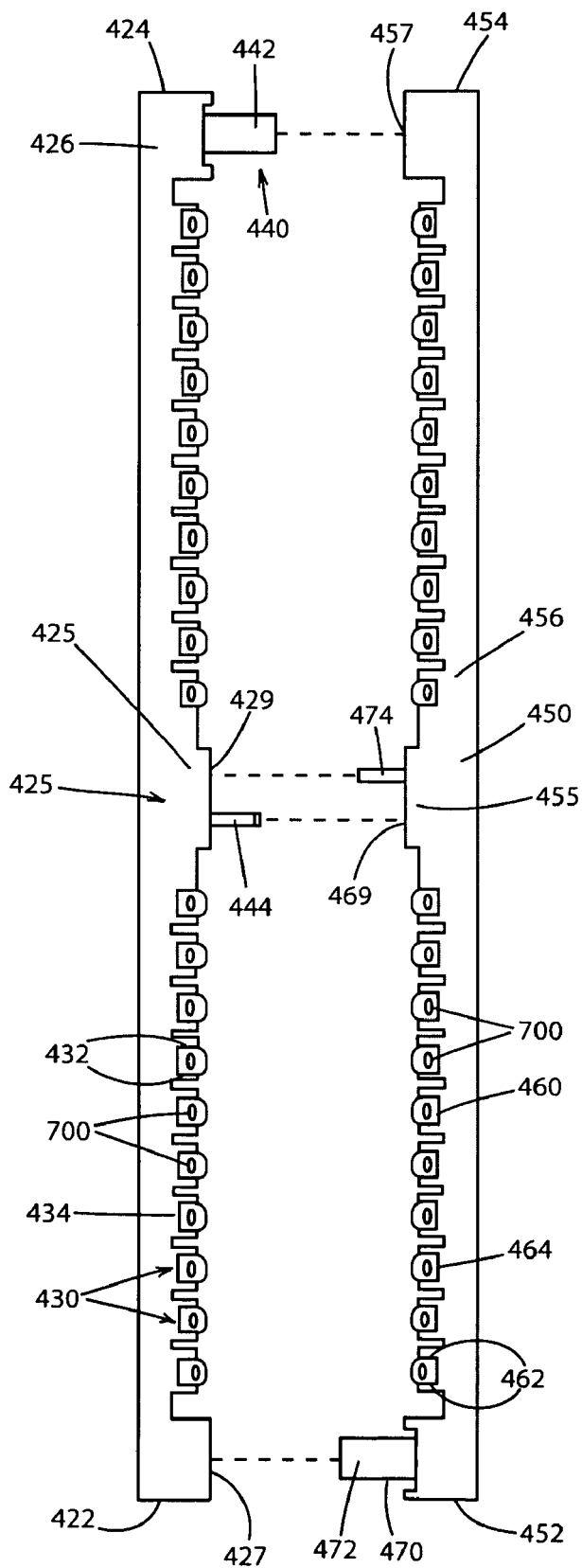
FIG. 6 is a top plan exploded view of the connector of FIG. 4.

The step 770 preferably does not extend out beyond the side walls 432, 462 of the solder retaining members 430, 460 (FIG. 6). The step 770 can be an integral part of the first and second connector parts 420, 450 as is the case when the step 770 is formed during a common molding process.

Although a preferred embodiment has been disclosed for illustrative purposes, those skilled in the art will appreciate that many additions, modifications and substitutions are possible without departing from the scope and spirit of the invention.

We claim:

1. An electrical connector for electrically connecting a first electronic device having a plurality of first contacts to a second electronic device having a plurality of second contacts, the electrical connector comprising:

a housing including first and second opposed rows of vertically oriented solder retention channels, each solder retention channel having a solder segment disposed therein and each solder retention channel having a vertical wall partially surrounding the solder segment disposed within the respective solder retention channel such that at least a vertical surface and a bottom end of the solder segment are exposed, the first and second rows of solder retention channels having an open space therebetween for receiving the first electronic device, wherein the first electronic device is for placement perpendicular to the second electronic device such that first contacts disposed on a vertical face of the first electronic device are disposed adjacent to and generally confronting a corresponding solder segment and second contacts disposed on a top surface of the second electronic device are disposed below and generally confronting a corresponding solder segment such that upon reflow of the solder segments, an electrical connection is formed directly between the first contacts of the first electronic device and corresponding second contacts of the second electronic device via the respective reflowed solder segements.

2. The electrical connector of claim 1 wherein the first electronic device comprises a first printed circuit board and the second electronic devices comprises a second printed circuit board.

3. An electrical connector for electrically connecting a plurality of first contact having a first predetermined spacing and disposed in opposed relation on opposite sides of a first electronic device along a lower edge thereof, to a corresponding plurality of second contacts disposed on a top surface of a second electronic device, wherein the second contacts are arranged in first and second rows with contacts arranged with a second predetermined spacing, the connector comprising:

a molded plastic housing that includes, a plurality of opposed, spaced, vertical, solder retention channels in the housing, at least some of the solder retention channels having a solder segment disposed within the respective channel in a vertical orientation the solder segments having a bottom end and an exposed inward facing surface when disposed within the solder retention channels, the housing defining a slot between the opposed inward facing surfaces of solder segments disposed within respective solder retention channels, the slot sized to receive the lower edge of the first electronic device, wherein the solder retention channels are spaced within the housing such that when the housing is disposed in a mounting position on the second electronic device, the bottom end of the solder segments are disposed in aligned opposed relation with respect to corresponding second contacts of the second electronic device and when the lower edge of the first electronic device is disposed in a mounting position within the slot, the inward facing surfaces of the solder segments are disposed in opposed aligned relation with corresponding first contacts of the first electronic device such that upon reflow and solidification of the solder segments, an electrical connection is formed directly by the reflowed solder segments between first contacts of the first electronic device and corresponding second contacts of the second electronic device.

4. The electrical connector of claim 3 wherein the first electronic device comprises a first printed circuit board and the second electronic devices comprises a second printed circuit board.

5. An electrical connector for electrically connecting a first electronic device to a second electronic device comprising:

a housing that includes a plurality of solder retention channels that hold a plurality of solder segments in a vertical orientation such that at least a vertical surface and one end of each solder segment is exposed, the solder retention channels being formed in first and second opposing rows with an open space formed between exposed vertical surfaces of the solder segments facing one another, wherein the solder retention channels include a solder retention element formed therein for limiting axial movement of the respective solder segment within the corresponding channel, the solder retention element comprising a protrusion that extends into the respective solder retention channel and is received within the solder segment to limit axial movement in the vertical direction.

6. The connector of claim 5, wherein the protrusion is formed in approximately a middle section of the channel as measured along a vertical axis.

7. The electrical connector of claim 5 wherein the first electronic device comprises a first printed circuit board and the second electronic devices comprises a second printed circuit board.

8. An electrical connector for electrically connecting first contacts disposed on opposed surfaces along a lower edge of a first electronic device having a predetermined thickness to second contacts disposed on a top surface of a second electronic device comprising:

a molded plastic housing that includes a plurality of vertical, spaced, solder retention channels in the housing arranged in first and second opposed rows;

a plurality of solder segments disposed in a vertical orientation within respective solder retention channels such that at least an inward facing vertical surface and a bottom end of each solder segment are exposed, the inward facing surfaces of solder segments disposed in solder retention channels of the first and second opposed rows of solder retention channels, the inward facing surfaces of the solder segments in opposed first and second rows of solder retention channels defining a slot therebetween generally having a width corresponding to the thickness of the first electronic device said inward facing surfaces of said solder segments being disposed in confronting relation with corresponding first contacts of the first electronic device when the lower edge of the first electronic device is disposed in confronting relation with slot and said bottom ends of said solder segments being disposed in confronting relation with corresponding second contacts on the top surface of the second electronic device when the housing is disposed in a mounting position on the top surface of the second electronic device.

9. The connector of claim 2, wherein both a top end and the bottom end of the solder segments are exposed prior to positioning the housing in the mounting position on the surface of the second electronic device.

10. The connector of claim 8, wherein the housing and the slot defined therein are sized and configured for receiving the first electronic device such that the first electronic device stands in the slot in an upstanding, vertical manner generally perpendicular to the second electronic device.

11. The connector of claim 8, wherein the solder retention channels have a vertical height that is greater than a width of the solder retention channels defined between side walls of the respective solder retention channels.

12. The connector of claim 8, wherein a depth of the solder retention channels is less than a depth of corresponding solder segments disposed within the solder retention channels resulting in the solder segments at least partially extending beyond the side walls that define the respective solder retention channels.

13. The electrical connector of claim 8 wherein the first electronic device comprises a first printed circuit board and the second electronic devices comprises a second printed circuit board.

14. The connector of claim 8, wherein each solder retention channel is defined by a pair of opposing side walls and a rear wall and the solder segments are frictionally held within the respective solder retention channels between the side walls.

15. The connector of claim 14, wherein there is a space formed between adjacent side walls associated with two different solder retention channels.

16. The connector of claim 8, wherein the housing is formed of a first part and a second part, the first part including the first row of solder retention channels and the second part including the second row of solder retention channels.

17. The connector of claim 16, wherein the first and second parts are snap-fittingly connected to one another.

18. The connector of claim 16, wherein the solder segments in each of the first and second rows of solder retention channels are spaced from one another so as to form pairs of opposing solder segments, wherein one pair of opposing solder segments electrically connects one pair of first contacts on the opposed surfaces of the first electronic device to one pair of second contacts of the second electronic device.

19. The connector of claim 16, wherein a bottom surface of the connector is a planar surface to permit the connector to sit flush against the top surface of the second electronic device, the second electronic device including second contacts that are arranged in two rows, the connector for placement along the top surface such that bottom ends of the solder segments are disposed over corresponding second contacts within the two rows of the second contacts and a bottom edge of the first electronic device is disposed in a space between the two rows of the second contacts when the first electronic device is disposed in the mounting position within the slot, and the first and second contacts being perpendicular to one another when the first electronic device is disposed in the mounting position within the slot.

20. The connector of claim 16, wherein the first and second parts are attached at two ends thereof as well as at middle sections thereof, each middle section partitioning one row of solder segments into two different sections.

21. The connector of claim 20, wherein the lower edge of the first electronic device is captured between the first and second parts when the lower edge of the first electronic device is disposed in the mounting position within the slot.

22. The connector of claim 21, wherein the first electronic device includes a cutout formed along the lower edge to accommodate the middle sections of the first and second parts.

23. A method for electrically connecting first contacts of a first electronic device to second contacts of a second electronic device, wherein the first contacts include first and second rows of first contacts on opposing surfaces of the first electronic device and the first electronic device has a thickness, the method comprising the steps of:
  providing a connector that includes a molded plastic housing that has a plurality of spaced vertical solder retention channels arranged in first and second opposed rows;
  inserting with the plurality of vertical solder retention channels a plurality of solder segments disposed in a vertical orientation such that at least an inward facing vertical surface and a bottom end of each solder segment are exposed, the inward facing surfaces of opposed solder segments defining a slot having a width generally corresponding to the thickness of the first electronic device;
  placing the housing with the solder segments disposed within the corresponding solder retention channels on a top surface of the second electronic device so that the bottom ends of the solder segments confront corresponding second contacts on the second electronic device;
  inserting the first electronic device within the slot so that contacts in the first row of first contacts on the first electronic device are positioned adjacent the solder segments in the first row of solder retention channels and contacts in the second row of first contacts on the first electronic device are positioned adjacent the solder segments in the second row of solder retention channels; and
  reflowing the solder segments onto the first and second contacts to thereby directly electrically and mechanically connect first contacts of the first electronic device to corresponding second contacts of the second electronic device via the reflowed solder segments.

24. The method of claim 23, wherein the step of inserting the solder segments within the solder retention channels includes the step of pressing the solder segments into the channels with a tool causing a recessed imprint to be formed and resulting in the solder segment being directed into corners of the respective solder retention channels.

25. The method of claim 23, further comprising the step of restricting axial movement of the solder segments in a vertical direction in the respective solder retention channels by forming protrusions that extend into the respective solder retention channels and inserting the solder segments into the respective solder retention channels resulting in the protrusion being embedded in the respective solder segments.

26. The method of claim 23, wherein the first electronic device is a vertically oriented daughter card and the second electronic device is a horizontally oriented host card that is perpendicular to the first electronic device.

* * * * *